US006828249B2

United States Patent
Odor et al.

(10) Patent No.: US 6,828,249 B2
(45) Date of Patent: Dec. 7, 2004

(54) SYSTEM AND METHOD FOR ENHANCED MONITORING OF AN ETCH PROCESS

(75) Inventors: Catherine Odor, Richmond, VA (US); Richard Chapman, Glen Allen, VA (US)

(73) Assignee: Infineon Technologies Richmond, LP., Sandston, VA (US)

( * ) Notice: Subject to any disclaimer, the term of this patent is extended or adjusted under 35 U.S.C. 154(b) by 0 days.

(21) Appl. No.: 10/102,546

(22) Filed: Mar. 20, 2002

(65) Prior Publication Data
US 2003/0178390 A1 Sep. 25, 2003

(51) Int. Cl.[7] .......................... H01L 21/00; C23F 1/00; H05H 1/00
(52) U.S. Cl. ................ 438/714; 438/706; 216/60; 216/59; 156/345.25; 156/345.24
(58) Field of Search .................. 438/706, 714; 216/59, 60; 156/345.25, 345.24; 118/712

(56) References Cited

U.S. PATENT DOCUMENTS

| | | | | |
|---|---|---|---|---|
| 4,936,967 A | * | 6/1990 | Ikuhara et al. | 204/192.33 |
| 5,190,614 A | * | 3/1993 | Leach et al. | 216/59 |
| 5,261,998 A | * | 11/1993 | Kanetake et al. | 216/61 |
| 5,658,418 A | * | 8/1997 | Coronel et al. | 156/345.25 |

* cited by examiner

Primary Examiner—Parviz Hassanzadeh
(74) Attorney, Agent, or Firm—Brinks Hofer Gilson & Lione (57) ABSTRACT

A method for monitoring an etch process of a substrate that includes receiving a first signal having a first wavelength, deriving a second signal based on the first signal and combining the first signal with the second signal to produce a composite signal having a composite wavelength less than the first wavelength. The method further includes identifying one or more inflection points of the composite signal and determining an etch rate of an etch process by evaluating the inflection points and elapsed time between the inflection points.

13 Claims, 5 Drawing Sheets

SYSTEM AND METHOD FOR ENHANCED MONITORING OF AN ETCH PROCESS

BACKGROUND OF THE INVENTION

1. Field of the Invention

The present invention relates to a system and method for enhanced monitoring of an etch process.

2. Related Art

In the prior art, a lamp emits a certain wavelength of light or electromagnetic radiation that is reflected from the surface of a substrate (e.g., a semiconductor wafer) to monitor an etch depth and to stop an etch process at a particular etch depth. For example, a mercury vapor lamp with a wavelength of 2537 angstroms may be used to monitor the etch depth of a semiconductor wafer. As semiconductor devices are manufactured with greater circuit density and smaller features, greater control of etch depth for shallow etches is required. Shallow etches refer to any etch that has an etch depth of approximately 2000 angstroms or less. To be able to accurately monitor a shallow etch process, a lamp or electromagnetic source may be selected to have a wavelength commensurate with (e.g., less than or equal to) the etch depth of approximately 2000 angstroms. However, lamps or light sources that have wavelengths equal to or less than approximately 2000 angstroms tend to be unstable, too expensive, unavailable, or otherwise not practical. Thus, a need exists for an etch monitoring system and method that supports monitoring of a shallow etch process with or without a lamp that has a wavelength of approximately 2000 angstroms or less.

Without an accurate monitoring method for an etch process, the etch process may form etches which are less than or greater than a desired etch depth. Deviation from the desired etch depth may impair the performance of semiconductor devices formed in the substrate. Accordingly, a need exists for accurate monitoring to support improved control of an etch process, such as a shallow etch process.

SUMMARY OF THE INVENTION

One aspect of the present invention regards a method for monitoring an etch process of a substrate that includes receiving a first signal having a first wavelength, deriving a second signal based on the first signal and combining the first signal with the second signal to produce a composite signal having a composite wavelength less than the first wavelength. The method further includes identifying inflection points of the composite signal and determining an etch rate of an etch process by evaluating the inflection points and elapsed time between the inflection points.

A second aspect of the present invention regards a system for monitoring an etch process of a substrate that includes a detector for receiving a first signal having a first wavelength, a signal source for deriving a second signal based on the first signal and a combiner arranged to combine the first signal with the second signal to produce a composite signal having a composite wavelength less than the first wavelength. An inflection-point detector identifies one or more inflection points of the composite signal and an etch rate calculator arranged to determine an etch rate of an etch process by evaluating the identified inflection points and elapsed time between the inflection points.

The primary advantage of the present invention is the ability to simulate a light source with a short wavelength without incurring the consequences associated with high frequency source. (ie. Cost, instablility, etc) This simulation allows for more frequent and accurate calculations of the instantaneous etch rate.

Further advantages, as well as details, of the present invention ensue from the following description of a preferred embodiment, making reference to the drawings.

DETAILED DESCRIPTION OF THE PREFERRED EMBODIMENTS

Figure 1:
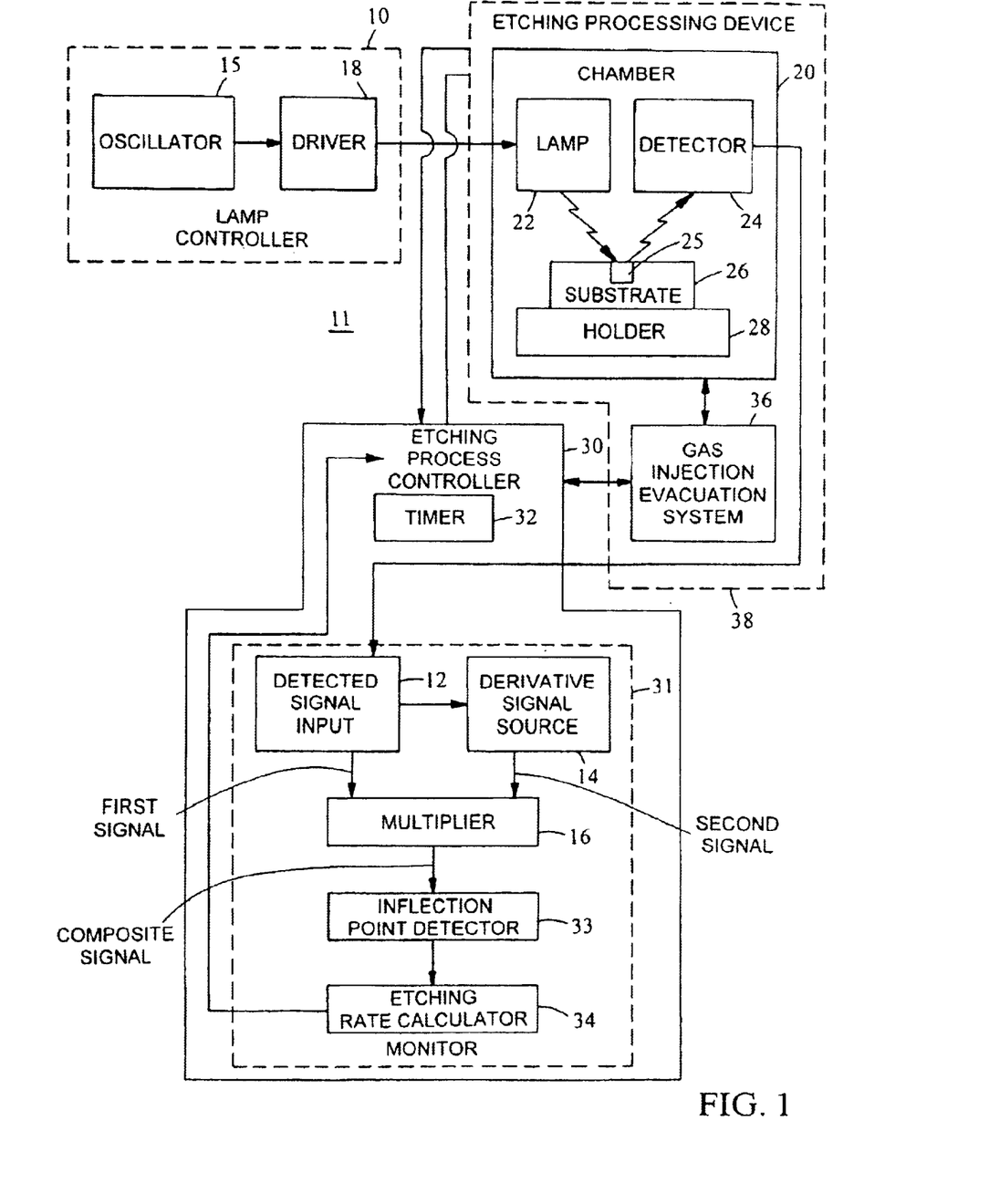
FIG. 1 is a block diagram of an embodiment of a system for enhanced monitoring of an etch process in accordance with the present invention.

FIG. 1 illustrates a block diagram of an embodiment of a system 11 for monitoring and controlling an etch process of a substrate 26 (e.g., a semiconductor wafer). The system 11 includes a lamp controller 10 coupled to a lamp 22 of an etch processing device 38. A detector 24 of the etch processing device 38 is coupled to an etch process controller 30.

In one embodiment, the lamp controller 10 includes an oscillator 15 coupled to a driver 18. The oscillator 15 oscillates to generate an alternating current signal (e.g., a square wave). The driver 18 may adjust the alternating current signal to a first voltage level and a second voltage level. For example, the first voltage level may be appropriate for turning on the lamp 22, while the second voltage level may be appropriate for maintaining the emission of light or electromagnetic radiation by the lamp 22. Of course, the use of an oscillator 15 and driver 18 can be omitted by using a single frequency source, such as a mercury bulb.

The etch processing device 38 includes a chamber 20 associated with a gas injection/evacuation system 36 for injecting an etchant gas into the chamber 20 or evacuating an etchant gas from an interior of the chamber 20. The lamp 22 illuminates the substrate 26 that rests on or is supported by a holder 28 within the chamber 20. The illuminating electromagnetic radiation from the lamp 22 illuminates an etch 25 (e.g., a shallow etch) of the substrate 26. Electromagnetic radiation reflected from the etch 25 or a target region of the substrate 26 is received by the detector 24 during the etch process. For example, the detector 24 detects an instantaneous intensity of a reflected signal from an etch 25 to determine a plot of signal intensity of the reflected signal versus a corresponding elapsed time of exposure of the substrate 26 to an etch process. The detector 24 may also receive electromagnetic radiation from other surfaces or target regions of the substrate other than the etch 25, however this can be significantly reduced if not completely eliminated by focusing the light on a small area in the center of the substrate. The detector 24 provides an output signal to the etch process controller 30.

The etch processing device 38 may refer to any of the following: a dry etch device, a reactive-ion etch device, a sputter etch device, and a vapor-phase etch device. Reactive-ion etch refers to exciting an etchant gas mixture in the chamber 20 with an electromagnetic source (other than the lamp 22) such that the etchant gas molecules form a plasma. The plasma includes ions that are directed toward the surface of the etch 25 or a target region of the substrate 26 to be etched. Sputter etch represents an etch process in which ions are directed toward a target region of the substrate 26 to etch it. Ideally, sputter etch excludes secondary chemical etch. Vapor phase etch refers to a dry etch technique where a chemical vapor and masks are used to selectively etch the substrate 26. The chemical vapor may refer to a hydrogen fluoride gas or another etchant gas.

The etch process controller 30 includes at least a monitor 31 and a timer 32. The monitor 31 monitors the etch process of the substrate 26 and the etch process controller 30 controls the etch process by controlling at least one etch parameter of the etch process. The timer 32 may be used to control one or more etch parameters. In one example, the etch process controller 30 may control the etch process by controlling a time of exposure of the substrate 26 to the etch process. In another example, the etch process controller 30 may control etchant gas pressure or concentration within the chamber 20. Accordingly, a gas injection/evacuation system 36 may remove etchant gas from the chamber 20 upon the expiration of the timer 32.

The monitor 31 may be used to determine an etch rate of the etch process of the substrate 26 within the chamber 20. The etch rate may include a local etch rate, an overall etch rate, or both. The local etch rate refers to an etch rate that is defined or bounded by two adjacent inflection points of a composite signal. As defined in this application an inflection point refers to a minimal signal intensity or a maximum signal intensity of the composite signal or another signal. The overall etch rate refers to an etch rate that is defined between any two nonadjacent inflection points of the composite signal. For example, the overall etch rate may represent an aggregate etch rate or a weighted aggregate etch rate of a series of local etch rates occurring during an etch process.

In the embodiment of FIG. 1, the monitor 31 includes a detected signal input 12 and a derivative signal source 14, which communicate with a multiplier 16. In turn, the multiplier 16 communicates with an inflection point detector 33. The inflection point detector 33 provides data to the etch rate calculator 34. The arrows interconnecting any of the foregoing components (12, 14, 16, 33 and 34) of the monitor 31 may represent physical data paths, logical data paths, or both.

The detector 24 outputs a first signal or another detected signal to the detected signal input 12. The detector 24 or the detected signal input 12 may convert the first signal from an analog signal to a digital signal. In one configuration, the detected signal input 12 contains buffer memory for storing or holding the first signal for processing by the multiplier 16. In one embodiment, the derivative signal source 14 includes a data processor and a memory. The data processor of the derivative signal source 14 derives the second signal from the first signal by determining a mathematical manipulation (e.g., a mathematical derivative or transformation) of the first signal and outputs the mathematical manipulation as a second signal.

In another embodiment, an alternate derivative signal source includes a derivative calculator and memory for storing a derivative of the first signal, which is referred to as the second signal.

A combiner, such as multiplier 16, combines the first and second signals by multiplying the first signal from the detected signal input 12 by the second signal generated by the derivative signal source 14 to produce a composite signal. The inflection point detector 33 evaluates the composite signal to identify one or more inflection points and the elapsed time between the identified inflection points. The etch rate calculator 34 determines an etch rate of the reflected substrate 26 by evaluating one or more inflection points of the composite signal versus an elapsed time of exposure of the substrate 26 to an etch process. The composite signal represents a modification of the reflected signal that was first emitted from the lamp 22 and later reflected from the substrate 26.

The etch process controller 30 may control an etch processing parameter based on the determined etch rate from the monitor 31. For example, the timer 32 of the etch process controller 30 may control the duration of the etch process based on the determined etch rate provided by the etch rate calculator 34. The etch process controller 30 or the timer 32 controls the duration of the etch process based on the determined etch rate to achieve a desired etch depth (e.g., otherwise possibly less than or equal to approximately 2000 angstroms) with greater accuracy than otherwise possible.

Figure 2:
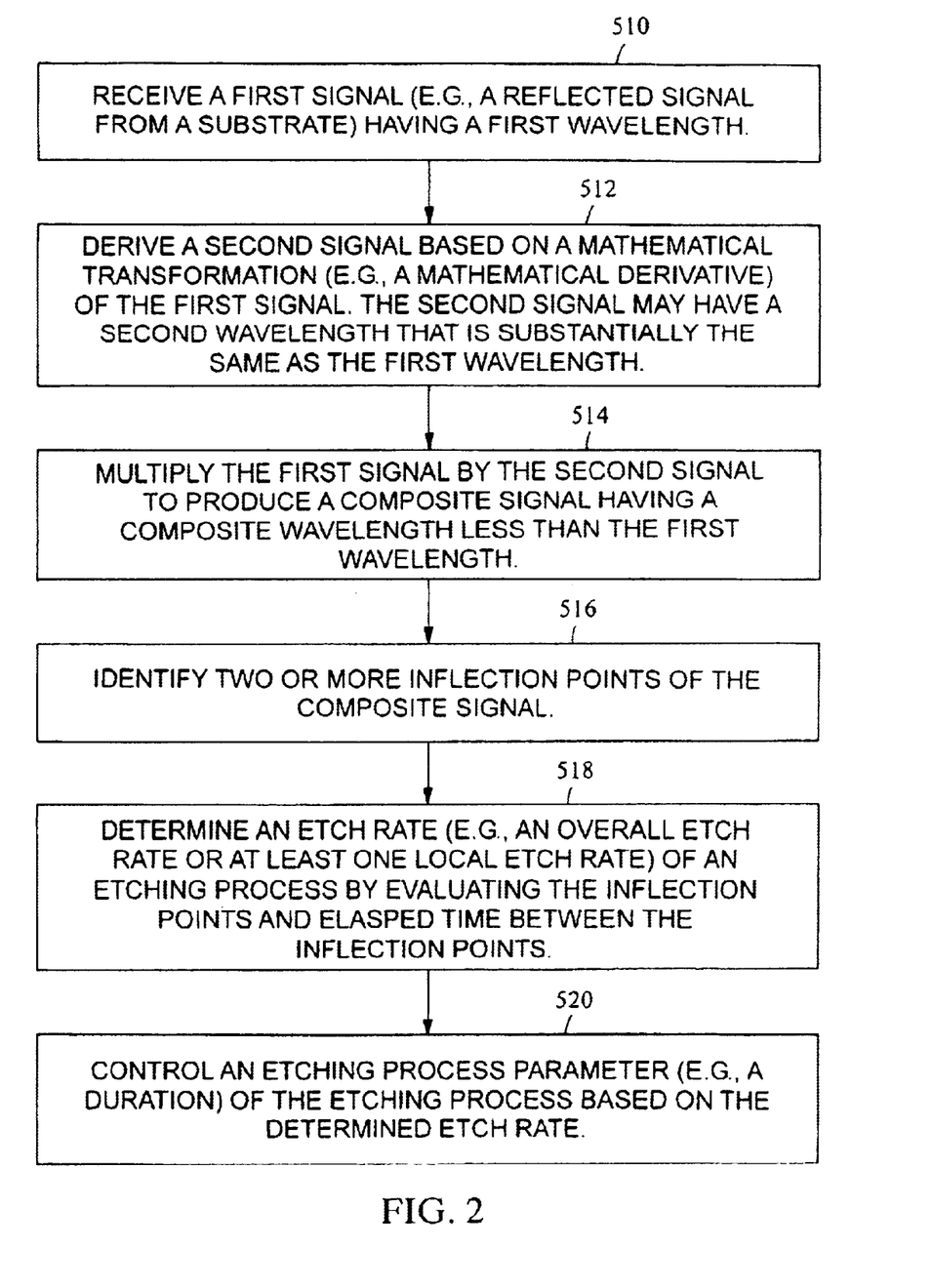
FIG. 2 is a flow chart demonstrating an embodiment of a method for monitoring an etch process in accordance with the present invention.

FIG. 2 illustrates a method of monitoring an etch process for an etch (e.g., a shallow etch having an etch depth of less than 2000 angstroms). The method of FIG. 2 begins in step S10.

In step S10, a detector 12 receives a first signal having a first wavelength. The first signal may represent an electromagnetic signal that is reflected from the substrate 26 or an etch region (e.g., an etch 25) of the substrate 26 after emanating from the lamp 22. The reflected signal may form an electromagnetic interference pattern upon reflection from the substrate 26. In one example, the first signal may be expressed by the following equation: $y(t)=A \sin(kt+\phi)$, where y is an observed signal intensity, A is an amplitude, t is time, k is a constant that defines a time period of the signal, and $\phi$ is a phase shift.

In step S12, a derivative digital signal source 14 generates or derives a second signal based on a mathematical manipulation (e.g., a mathematical derivative or transformation) of the first signal of step S10. A mathematical manipulation of the signal may be achieved by any of the following techniques: (1) software instructions for manipulating a digital signal representative of the first signal, (2) digital logical circuitry for manipulating a digital signal representative of the first signal, (3) electronic circuitry for manipulating the first signal, (4) a data processor for manipulating (e.g., taking a derivative of) the first signal, (5) a filter for filtering the first digital signal to provide the second digital signal, and (6) a signal generator (e.g., digital signal generator or a high stability oscillator) for generating the second signal. The second signal may have a second wavelength that is substantially the same as the first wavelength. The second signal may be derived from the first signal or may be independently generated.

In one embodiment, the second signal may represent a mathematical derivative of the first signal. The second signal may be expressed by the following equation: $y(t)'=kA \cos(kt+\phi)$, where y(t) is an observed signal intensity, A is an amplitude, t is time, k is a constant that defines a time period of the signal, φ is a phase shift, and where y(t)=A sin(kt+φ) represents the first signal.

In step S14, a multiplier 16 is arranged to multiply the first signal by the second signal to produce a composite signal having a composite wavelength less than the first wavelength. In general, the composite signal has a series of minimum and maximum amplitudes at which time the etch depth is known to be approximately an integral multiple of a quarter wavelength of the composite wavelength. The minimum and maximum amplitudes or signal intensities of the composite signal may be referred to as inflection points.

Consistent with the foregoing equations referenced in steps S10 and S12, the a composite signal may be expressed by the following equation: $y(t)*y(t)'=kA^2 \sin(kt+\phi)\cos(kt+\phi)=\frac{1}{2}kA^2 \sin(2kt+2\phi)$, where y(t) is an observed signal intensity, y'(t) is a derivative of the observed signal intensity, A is an amplitude, t is time, k is a constant that defines a time period of the signal, and φ is a phase shift. The product of the first signal and the second signal results in a function with double the original frequency of the first signal. Of course, should the etch rate change, then the frequency of the function will change as well. The greater frequency supports a greater number of inflection points (i.e., minimum amplitude and maximum amplitudes) to allow enhanced control of the etch process or a parameter thereof. The greater frequency also reduces the importance of the correct detection of the first inflection point after beginning the etch process. The reduction of reliance on the first inflection point may reduce error in the determination or estimation of an etch rate due to early instabilities in the etch process.

In step S16, the inflection point detector 33 identifies one or more inflection points of the composite signal. An inflection point refers to an instantaneous minimum or maximum amplitude or signal intensity of the composite signal of step S14.

In step S18, an etch rate calculator 34 of the monitor 31 determines an etch rate of the semiconductor process by evaluating the inflection points and elapsed time between inflection points of the composite signal.

In step S20, the etch process controller 30 controls an etch process parameter (e.g., an overall etch rate or at least one local etch rate) of an etch process by evaluating the determined etch rate of step S18. For example, the etch process controller 30 determines the duration of an etch process based on the determined etch rate received from the etch rate calculator 34. The etch process may be controlled by manipulating one or more of the following: a temperature of the chamber 20, a pressure of the etchant gas in the chamber 20, duration of the exposure to the etchant gas in the chamber 20, a concentration of the etchant gas in the chamber 20, and any other etch process parameter.

Figure 3A:
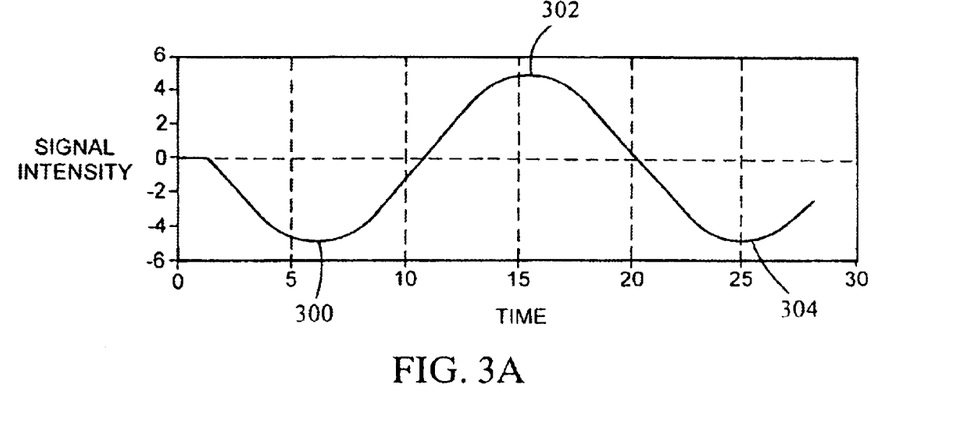
FIG. 3A shows a representative signal trace of a first signal outputted by a detector used in the system of FIG. 1.

FIG. 3A shows a representative signal trace of the first signal. For example, FIG. 3A may represent an output of the detected signal input 12 to the multiplier 16. The vertical axis of FIG. 3A represents amplitude or signal intensity of the first signal. The horizontal axis of FIG. 3A represents the time. A time unit for the horizontal axis may represent a second or a fraction of a second, for example. The first signal may be modeled as a sine wave function or some other mathematical function. The first signal represents a precursor signal to the second signal. An inflection point refers to a point of a signal (e.g., the first signal) where a minimum or maximum signal intensity is present. FIG. 3A shows three inflection points, including a first inflection point 300 at 6 time units, a second inflection point 302 at 15 time units, and a third inflection point 304 at 25 time units.

Figure 3B:
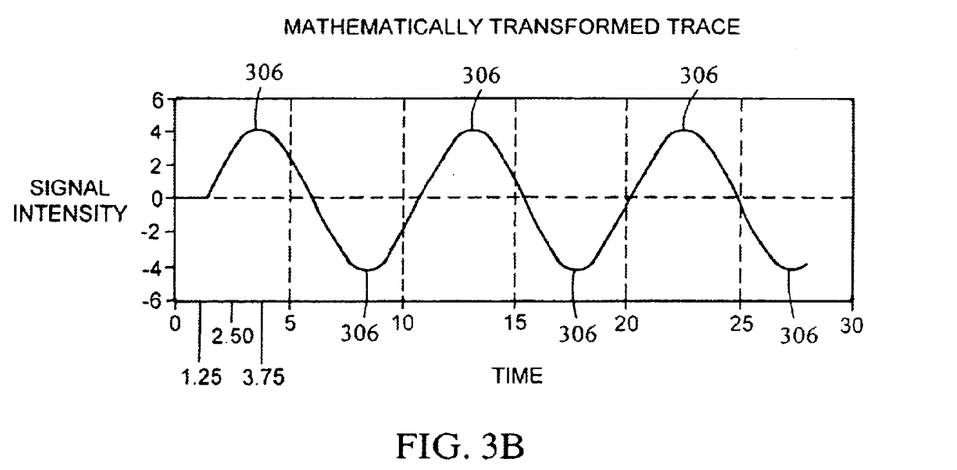
FIG. 3B shows a representative signal trace of a composite signal formed by the system of FIG. 1.

FIG. 3B shows a representative signal trace of the composite signal formed by combining or multiplying the first signal and the second signal. For example, FIG. 3B may represent an output of the multiplier 16. The vertical axis of FIG. 3B represents an amplitude or signal intensity of the first signal. The horizontal axis of FIG. 3B represents time.

As illustrated in FIG. 3A and FIG. 3B, the second signal is at double the frequency (i.e., one-half the wavelength) of the first signal. FIG. 3B shows six inflection points (306), including inflection points at approximately 3, 7, 13, 18, 23 and 27 time units.

Figure 4:
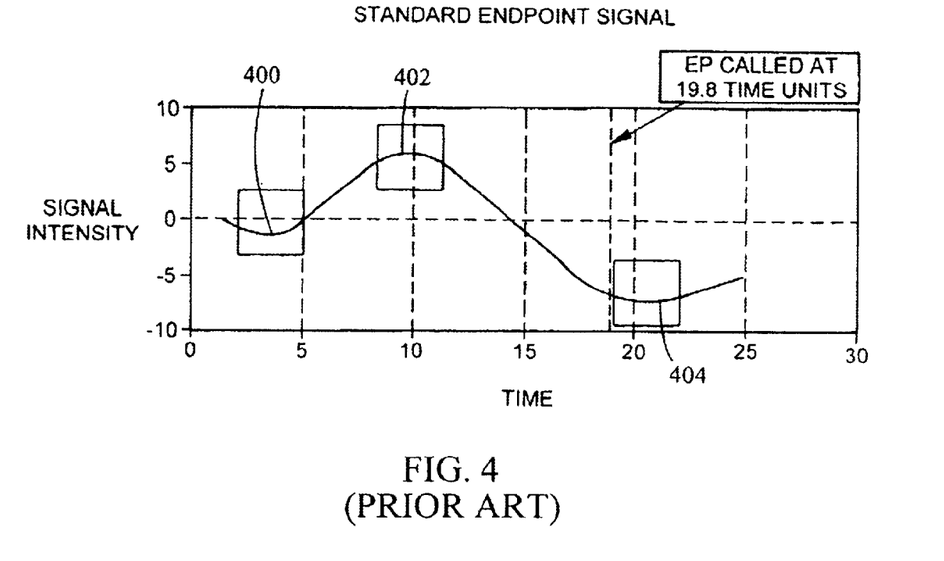
FIG. 4 is a representative signal trace of a signal reflected from a substrate and processed in accordance with a prior art endpoint detection scheme.

FIG. 4 illustrates a prior art determination of an end point for stopping the etch process for an etch in a substrate 26. As illustrated in FIG. 4, the prior art determination of the end point merely relies upon measurement of two inflection points (400, 402). From time equals approximately zero units until three units at the first inflection point 400, the etch depth of the etch may progress from zero to approximately one-quarter wavelength. From time equals approximately three units (at the first inflection point 400) to approximately ten units (at the second inflection point 402), the etch depth of the etch may progress from one-quarter wavelength to one-half wavelength. From time equals approximately ten units (at the second inflection point 402) to approximately 21 time units (at the third inflection point 404), the depth of the etch depth may progress from one-half wavelength to three-quarters wavelength of the wavelength emitted from the lamp 22.

The etch rate between the first inflection point 400 and the second inflection point 402 is greater than the etch rate between the second inflection point 402 and the third inflection point 404. In the prior art, the prior art etch equipment may estimate the etch stop time a 19.8 time units (e.g., seconds) based on the etch rate between the first inflection point 400 and the second inflection 402 point. Accordingly, the etch depth may not be as great as the desired etch depth because of the decrease in the etch rate between the second inflection point 402 and the third inflection point 404 is not properly considered. Using the prior art endpoint algorithm, the decrease in the etch rate between the second inflection point 402 and the third inflection point 404 would not have been detected in time to properly control the etch process to limit the etch depth of an etch in the substrate 26. In hindsight, the appropriate endpoint time based on all three inflection points (400, 402, 404) should have been approximate 25.8 time units (e.g., seconds) to achieve the desired etch depth. Here, the desired etch depth is greater than or equal to three-quarters wavelength of the electromagnetic radiation a emitted by the lamp 22.

Figure 5:
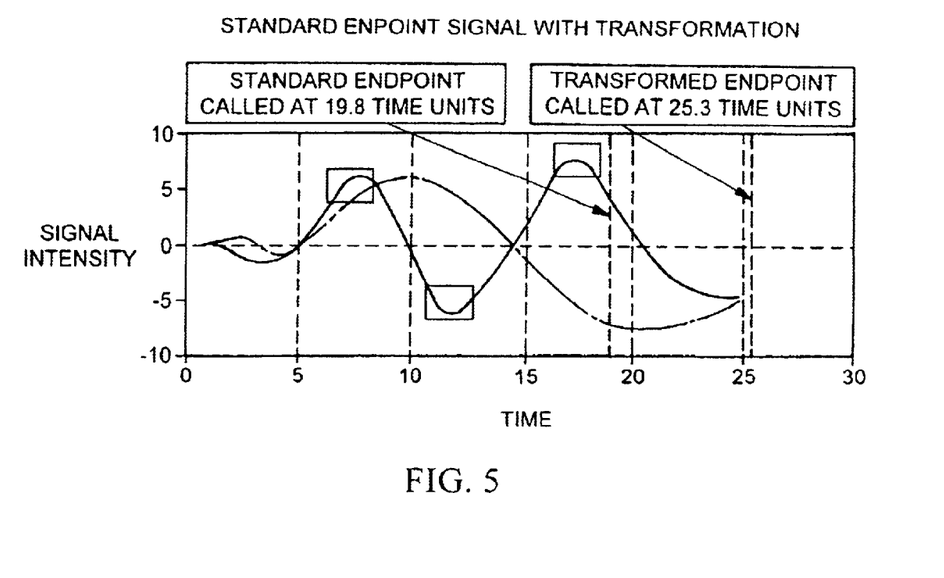
FIG. 5 compares the prior art signal trace of a lesser frequency of FIG. 4 to a composite signal trace of a greater frequency found by the system of FIG. 1.

FIG. 5 shows a first signal trace of a signal reflected from the substrate 26 compared to a second signal trace of a composite signal and illustrates that the composite signal has a greater number of inflection points than the first signal trace. The first signal trace may represent the signal trace of FIG. 4, for example. At the etch process controller 30, the etch rate calculator 34 derives an etch rate based on the inflection points identified by the inflection point detector 33 in a composite signal derived from a reflected signal (e.g., the first signal) reflected from the substrate 26. In turn, the timer 32 may identify an endpoint or stop time for the etch process based upon the determination of an overall etch rate or multiple local or instantaneous etch rates for the etch process. For example, the etch process controller 30 determines the depth of the etch at the time of determining an instantaneous etch rate. Based on the determined depth and the determined instantaneous etch rate, the etch process controller 30 determines a time to stop the etch process so as to obtain a desired depth for the etch.

The etch rate between adjacent pairs of inflection points may be determined. The occurrence of each successive inflection point represents a quarter wavelength addition of the signal being used for evaluation, ie: the composite signal to a cumulative depth of an etch in the substrate 26. An etch rate can be more accurately calculated and more frequently adjusted by increasing the number of inflection points per unit time. For example, the number of inflection points per unit time may be increased by mathematical manipulation of the first signal. Increasing the number of inflection points improves the robustness and resolution of the endpoint for stopping the etch process. With this improvement, the endpoint can be used for more shallow etches than would otherwise be possible. Further, the endpoint or stop time of the etch process may be determined with greater precision to yield etches with desired etch depths and desired manufacturing tolerances. Semiconductor manufactures might realize greater circuit density and improved performance by improved monitoring of an etch rate of an etch process.

The etch rate calculator 34 or the monitor 31 determines a decrease in the etch rate of FIG. 5 that was not detected at all or in time for control of the etch process of FIG. 4. The resulting endpoint time of FIG. 5 would have been more accurate at 25.3 time units, as opposed to 19.8 time units as estimated from FIG. 4. An added benefit of the process is that the first few inflection points of the detected reflection can be disregarded to allow the etch process to fully stabilize contrary to the prior art. All of the foregoing values of time units are for illustrative purposes and virtually any value of the time units may be used. Please note that the etch rate calculator 34 is able to measure two etch rates: the instantaneous etch rate and the overall or average rate. The instantaneous etch rate is defined for the purpose of this application as the etch rate between two consecutive inflection points. Of course, the shorter the time span between consecutive inflection points, the more accurate the instantaneous etch rate will be. The overall or average etch rate is defined for the purpose of this application as the rate from a first inflection point to a most recent or last inflection point.

A derivative is only one example of a mathematical manipulation that can be performed on the first signal. The number of possible transformations or manipulations of the first signal is virtually infinite. These manipulations could be made mathematically via software code or instructions. Likewise, the transformations could be performed by electronically manipulating the signal. For example, the mathematical manipulation could be done by processing the end point signal using electronic filters prior to applying the inflection point detector 33 or the end point algorithm. The end point algorithm determines a stop time or end time for an etch process based on the determined etch rate. Manipulations in the endpoint algorithm, with required software modifications, may provide similar results.

Figure 6:
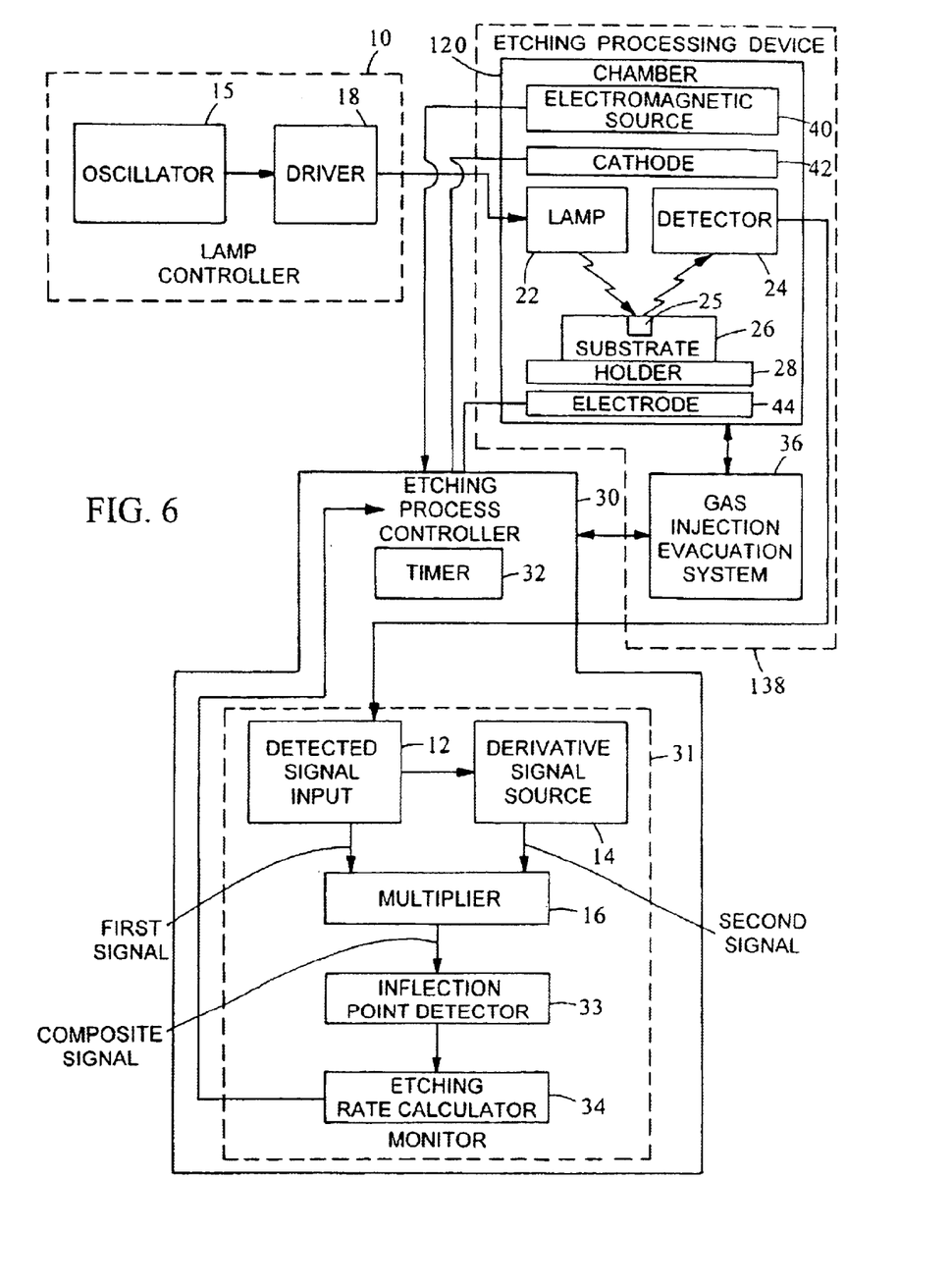
FIG. 6 is a block diagram of a second embodiment of a system for enhanced control of an etch process in accordance with the present invention.

FIG. 6 illustrates an alternate embodiment of an etch processing device 38. The system of FIG. 6 is similar to the system of FIG. 1, except the system of FIG. 1 replaces the etch processing device 38 with an alternate etch processing device 138. Like reference numbers in FIG. 1 and FIG. 6 refer to like elements.

The alternate etch processing device 138 includes an electromagnetic source 40, a cathode 42 and an electrode 44. The etch process controller 30 controls the operation of at least one of the electromagnetic source 40, the electrode 44, the cathode 42, and the gas injection evaluation system 36.

The electrode 44 and the cathode 42 are positioned on opposite sides of the substrate 26. The electrode 44 and the cathode 42 are charged to accelerate ions toward the substrate 26 to etch it at an etch 25 or etch region.

The alternate etch processing device 138 may represent a reactive ion etch device. The reactive ion etch may support control of the etch process through modulation of one or more of the following: 1) the electromagnetic radiation emitted by the electromagnetic source 40 for exciting the etchant gas, 2) the intensity of the electromagnetic signal generated by the electromagnetic source 40 for exciting the etchant gas, 3) the duration or duty cycle of the electromagnetic signal generated by the electromagnetic source 40 for exciting the etchant gas, 4) the voltage potential applied across the electrode 44 and the cathode 42, 5) the pressure of the etchant gas in the chamber 120, 6) the concentration of the etchant gas within the chamber 120, 7) the time of exposure of the substrate 26 to the etchant gas within the chamber 120, 8) the introduction of gas into the chamber 120, and 9) the removal of etchant gas into the chamber 120.

By mathematically manipulating the existing signal, the desired results can be achieved using a commercially available light source (e.g., a mercury vapor lamp) for shallow etch. Mathematical manipulation of the interferometric endpoint (IEP) signal may increase signal resolution and, hence, improve etch depth control.

The foregoing description of the invention describes several illustrative embodiments. Other embodiments, variations, alterations or alternatives may fall within the scope of the invention and the following claims. Accordingly, the claims should be accorded the broadest interpretation possible consistent with the specification set forth in the description.

We claim:

1. A method for monitoring an etch process of a substrate, the method comprising:

receiving a first signal having a first wavelength;

deriving a second signal based on said first signal;

combining said first signal with said second signal to produce a composite signal having a composite wavelength less than said first wavelength;

identifying one or more inflection points of said composite signal;

determining an etch rate of an etch process by evaluating said inflection points and elapsed time between said inflection points;

wherein said first signal is represented by the following equation: $y(t) = A \sin(kt+\phi)$, where y is an observed signal intensity, A is an amplitude of said first signal, k is a constant that defines a time period of said first signal, t is time, and $\phi$ is a phase shift of said first signal;

wherein said second signal is represented by the following equation: $y(t)' = dy/dt = kA \cos(kt+\phi)$; and wherein said combining comprises multiplying said first signal by said second signal to produce said composite signal.

2. The method according to claim 1, further comprising etch a substrate with radiation having a wavelength equal to said first wavelength.

3. The method according to claim 2, wherein said composite wavelength is less than or equal to 2000 angstroms.

4. The method according to claim 2 further comprising:

determining at least one instantaneous etch rate of said etch process by detecting said composite signal;

controlling a duration of said etch process based on said determined at least one instantaneous etch rate, where an etch depth of an etch formed in said substrate is less than or equal to approximately 2000 angstroms.

5. The method according to claim 4, wherein said controlling comprises determining a depth of said etch when determining said at least one instantaneous etch rate and determining a time to stop said etch process based on said determined depth and said determined said at least one instantaneous etch rate.

6. The method according to claim 1, wherein said first wavelength is less than or equal to 2000 angstroms.

7. The method according to claim 1, wherein said inflection points of said composite signal refer to a series of minimum and maximum amplitudes, wherein an elapsed time between a minimum amplitude and a next subsequent maximum amplitude represents an increase of depth of an etch formed during said etch process by an amount equal to approximately an integral multiple, n, of a quarter wavelength of said composite wavelength.

8. The method according to claim 7, wherein n=1.

9. The method according to claim 1, further comprising controlling an etch process parameter of said etch process based on said determined etch rate.

10. The method according to claim 1, further comprising determining an average etch rate as said etch rate.

11. The method according to claim 1 further comprising determining an instantaneous etch rate as said etch rate by detecting one or more inflection points of said composite signal versus an elapsed time of exposure to said etch process.

12. The method according to claim 1 further comprising:
determining at least one instantaneous etch rate as said etch rate by detecting said composite signal;
controlling a duration of said etch process based on said determined at least one instantaneous etch rate.

13. The method according to claim 12, wherein said controlling comprises determining a depth of said etch when determining said at least one instantaneous etch rate and determining a time to stop said etch process based on said determined depth and said determined said at least one instantaneous etch rate.

* * * * *